United States Patent
Kasai et al.

(10) Patent No.: US 6,258,512 B1
(45) Date of Patent: Jul. 10, 2001

(54) METHOD FOR PREPARATION OF LITHOGRAPHIC PRINTING PLATE AND LITHOGRAPHIC PRINTING PLATE PREPARED THEREBY

(75) Inventors: Seishi Kasai; Eiichi Kato, both of Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 09/396,851

(22) Filed: Sep. 15, 1999

(51) Int. Cl.[7] ................. G03F 7/40; G03F 7/20
(52) U.S. Cl. .......... 430/302; 430/309; 430/947; 101/456
(58) Field of Search .................. 430/302, 947, 430/309; 101/456

(56) References Cited

U.S. PATENT DOCUMENTS 6,048,654 * 4/2000 Nakayama et al. ............... 430/302

* cited by examiner

*Primary Examiner*—Cynthia Hamilton
(74) *Attorney, Agent, or Firm*—Reed Smith LLP

(57) ABSTRACT

A method for the preparation of a lithographic printing plate comprises exposing imagewise a lithographic printing plate precursor comprising a support having provided thereon a light-sensitive layer containing fine anatase-type titanium oxide grains and a complex composed of an organo-metallic polymer and an organic polymer containing at least one member selected from the group consisting of an amido bond, a urethane bond, a ureido bond and a hydroxy group to an ultraviolet ray to render a surface of the light-sensitive layer hydrophilic in the exposed area. A lithographic printing plate prepared according to the method is also disclosed.

11 Claims, No Drawings

METHOD FOR PREPARATION OF LITHOGRAPHIC PRINTING PLATE AND LITHOGRAPHIC PRINTING PLATE PREPARED THEREBY

FIELD OF THE INVENTION

The present invention relates to a method for the preparation of a lithographic printing plate, and more particularly to a novel method for the preparation of a processless lithographic printing plate which provides a lithographic printing plate only by imagewise exposure without undergoing development processing.

BACKGROUND OF THE INVENTION

Lithographic printing plate precursors mainly employed in the field of small-scale commercial printing include (1) a direct drawing type printing plate precursor comprising a water-resistant support having provided thereon a hydrophilic image-receiving layer, (2) a printing plate precursor comprising a water-resistant support having provided thereon an oleophilic image-receiving layer containing zinc oxide, which is subjected to desensitizing treatment with a desensitizing solution after image formation to render the non-image area hydrophilic, thereby providing a printing plate, (3) a printing plate precursor of an electrophotographic light-sensitive material comprising a water-resistant support having provided thereon a photoconductive layer containing photoconductive zinc oxide, which is subjected to desensitizing treatment with a desensitizing solution after image formation to render the non-image area hydrophilic, thereby providing a printing plate, (4) a printing plate precursor of silver halide photographic material comprising a water-resistant support having provided thereon a silver halide emulsion layer, (5) a presensitized printing (PS) plate comprising an aluminum support having a hydrophilic surface having provided thereon a layer capable of forming a resin image upon exposure to an ultraviolet ray, and (6) a water-less presensitized printing (PS) plate comprising an aluminum support having provided thereon a photosensitive layer and a silicone rubber layer.

However, these printing plate precursors have problems, respectively. For instance, although printing plate precursors of type (1) are simple, they may not reach the satisfactory level in view of image qualities and background stains in the non-image areas required to prints, and printing durability (press-life). On the other hand, wet processing such as desensitizing treatment or sensitizing treatment is required in case of using printing plate precursors of type (2), (3) and (4), and treatment with an aqueous alkaline solution or an aqueous organic solvent solution is indispensable in case of using printing plate precursors (5) and (6) in order to form printing plates so that increased cost due to employing complicated and large-sized machines for the treatment and undesirable influence on environment caused by waste materials such as exhausted treating solutions are accompanied.

Recently, in the field of printing, computerization of plate-making steps has rapidly proceeded, and a plate-making system in which layout of letters, images and the like is determined on a computer and the information is directly output from an output device to a printing plate precursor draws attention.

Specifically, it is possible to directly produce a printing plate from digital data by exposure with a laser beam without using intermediate films and conventional optical printing methods. As the result, lithographic printing plate precursors which do not need wet processing such as desensitizing treatment or sensitizing treatment, development processing with an aqueous alkaline solution or an aqueous organic solvent solution and baking treatment have been proposed.

Examples thereof include a printing plate precursor having a heat-sensitive layer comprising a polymer containing heat-decomposable carboxylic ester groups associated with a compound capable of converting light to heat, which forms a printing plate by exposure with a heat laser to decompose the ester groups to generate carboxy groups, thereby rendering its surface hydrophilic, without wet processing, as described in EP-652,483, a printing plate precursor having a hydrophobic resin surface containing a compound capable of converting light to heat, which forms a printing plate by sulfonating to render its whole surface hydrophilic and exposing with a heat laser to remove the sulfonic groups by heating, thereby rendering its surface hydrophobic to form an image as described in JP-A-60-132760 (the term "JP-A" as used herein means an "unexamined published Japanese patent application"), a printing plate precursor having a photosensitive layer containing a electroconductive polymer, which forms a printing plate by scanning an electrochemical or electric signal, thereby converting hydrophilic-hydrophobic property of its surface as described in EP-279,066, and a printing plate precursor comprising zirconia ceramic, which forms a printing plate by exposing its surface with a heat laser to convert oxidation state of the oxide, thereby changing its surface property from hydrophilic to hydrophobic as described in EP-769,372.

However, these lithographic printing plate precursors have one or more disadvantages which restrict practical use.

For example, difference in a property between an oleophilic image portion and a hydrophilic non-image portion is not large enough in many cases and fatal defect in that background stains occur in prints or printing ink dose not sufficiently adhere on the image portion is accompanied. Also, dampening water used for printing is restricted. Further, materials contained in the printing plate precursors may cause problems due to their poor storage stability.

SUMMARY OF THE INVENTION

Therefore, the present invention has been made in order to overcome the many problems and restrictions in the prior art described above.

Specifically, an object of the present invention is to provide a method for the preparation of a lithographic printing plate which provides a lithographic printing plate in a simple and cheap manner without undergoing wet processing such as desensitizing treatment, sensitizing treatment or alkaline processing.

Another object of the present invention is to provide a method for the preparation of a lithographic printing plate only by image formation upon imagewise exposure with an ultraviolet ray.

A further object of the present invention is to provide a lithographic printing plate which is prepared only by imagewise exposure with an ultraviolet ray.

Other objects of the present invention will become apparent from the following description.

It has been found that these objects of the present invention are accomplished by the following items (1) and (2):

(1) a method for the preparation of a lithographic printing plate comprises exposing imagewise a lithographic printing plate precursor comprising a support having provided thereon a light-sensitive layer containing fine anatase-type titanium oxide grains and a complex composed of an organo-metallic polymer and an organic polymer containing at least one member selected from the group consisting of an amido bond, a urethane bond, a ureido bond and a hydroxy group to an ultraviolet ray to render a surface of the light-sensitive layer hydrophilic in the exposed area, and (2) a lithographic printing plate prepared according to the method as described in item (1) above.

DETAILED DESCRIPTION OF THE INVENTION

The present invention also includes the following embodiments:

(3) a method for the preparation of a lithographic printing plate as described in item (1) above, wherein the organo-metallic polymer is a polymer formed by a hydrolysis polymerization condensation reaction of at least one organo-metallic compound represented by the following formula (I):

$$(R^0)_n M(Y)_{x-n} \quad (I)$$

wherein $R^0$ represents a hydrogen atoms, a hydrocarbon group or a heterocyclic group; Y represents a reactive group; M represents a metallic atom having from 3 to 6 valences; x represents a valence of the metallic atom M; and n represents 0, 1, 2, 3 or 4, provided that the balance of x−n is not less than 2, (4) a method for the preparation of a lithographic printing plate as described in item (1) above, wherein a surface of the light-sensitive layer in the area unexposed with the ultraviolet ray has a contact angle with water of 20 degrees or more and the surface of the light-sensitive layer in the area exposed with the ultraviolet ray has a contact angle with water of 10 degrees or less, (5) a method for the preparation of a lithographic printing plate as described in item (1) above, wherein the imagewise exposure is conducted using an ultraviolet laser beam, and (6) a method for the preparation of a lithographic printing plate which comprises after conducting printing using the lithographic printing plate prepared according to the method as described in item (1) above, removing printing ink from the lithographic printing plate, subjecting the surface of the light-sensitive layer of the lithographic printing plate to heat treatment to turn the hydrophilic property in the exposed area to the inherent hydrophobic property, thereby reproducing the lithographic printing plate precursor, and repeating the method as described in item (1) above.

The present invention exploits polar conversion of fine anatase-type titanium oxide grains from the oleophilic condition to the hydrophilic condition, in which the fine anatase-type titanium oxide grains are photoexcited upon irradiation with an ultraviolet ray to render their surfaces hydrophilic. The method for the preparation of a lithographic printing plate according to the present invention is characterized by forming an image pattern upon imagewise exposure of a surface of a light-sensitive layer containing fine anatase-type titanium oxide grains and a binder for dispersing the grains and film-forming with an ultraviolet ray such as a laser beam having absorption in an ultraviolet region.

The method for the preparation of a lithographic printing plate according to the present invention has many advantages in comparison with conventionally known methods of preparing lithographic printing plates.

Specifically, since chemical treatment is not employed for the preparation of a lithographic printing plate, trouble, expenditure and undesirable influence on environment resulting from using a desensitizing treatment solution containing potassium ferrocyanide or an aqueous alkaline developing solution are avoided. Further, a lithographic printing plate can be directly prepared by conducting ultraviolet ray exposure based on digital data to the lithographic printing plate precursor according to the present invention without employing intermediate films and conventional optical printing method. Moreover, the lithographic printing plate prepared according to the present invention can be reused. Specifically, after removing printing ink from the surface of the printing plate, the printing plate is subjected to heat treatment, whereby the hydrophilic image-exposed area returns to the inherent hydrophobic state and the resulting printing plate precursor is repeatedly employed for plate-making and printing.

According to the method for the preparation of a lithographic printing plate using the lithographic printing plate precursor having a light-sensitive layer containing fine anatase-type titanium oxide grains and a resin of the complex composed of an organo-metallic polymer and a specific organic polymer according to the present invention, image formation and dry type desensitizing treatment can be conducted at once only by imagewise exposure with an ultraviolet ray in a simple manner, and no development processing is necessary to prepare a lithographic printing plate which can be subjected to printing using conventional ink and dampening water. Further, the lithographic printing plate provides a large number of prints having clear images without background stain.

Now, the lithographic printing plate precursor used in the method of the present invention will be described in more detail below.

The titanium oxide grains used in the present invention comprise those having the crystal structure of anatase-type, and have a feature in that they are photoexcited upon irradiation with an ultraviolet ray to render their surfaces hydrophilic as described above.

The phenomenon of changing a surface property of anatase-type titanium oxide grain to the hydrophilic condition upon irradiation with an ultraviolet ray is described in detail, for example, in Toshiya Watanabe, *Ceramics*, Vol. 31, No.10, page 837 (1966). However, there is no description on a lithographic printing plate. It is believed that the application of the phenomenon to the technical field of lithographic printing is new and brings a great advance in the art.

The average particle size of the anatase-type titanium oxide grains is preferably from 5 to 500 nm, more preferably from 5 to 100 nm. In such a range, the titanium oxide grain surface can obtain an appropriate hydrophilicity by irradiation with an ultraviolet ray.

The anatase-type titanium oxide grains are commercially available as powder or a titania sol dispersion manufactured, e.g., by Ishihara Sangyo Kaisha, Ltd., Titan Kogyo Kabushiki Kaisha, Sakai Chemical Industry Co., Ltd., Japan Aerosil Inc., or Nissan Chemical Industries, Ltd.

Further, the anatase-type titanium oxide grains used in the present invention may contain other metallic elements or oxides thereof. The term "contain" used herein includes the meanings of "cover the grain surface" and/or "carry in the inner part", and "dope in the inner part".

Examples of the other metallic element which may be contained in the titanium oxide grains include Si, Mg, V, Mn, Fe, Sn, Ni, Mo, Ru, Rh, Re, Os, Cr, Sb, In, Ir, Ta, Nb, Cs, Pd, Pt and Au. Specific examples thereof are described, e.g., in JP-A-7-228738, JP-A-7-187677, JP-A-8-81223, JP-A-8-257399, JP-A-8-283022, JP-A-9-25123, JP-A-9-71437 and JP-A-9-70532.

The proportion of the other metallic element or oxide thereof which may be contained in the anatase-type titanium oxide grains is preferably not more than 10% by weight, more preferably not more than 5% by weight, based on the total anatase-type titanium oxide grains.

The light-sensitive layer may contain inorganic pigment particles other than the anatase-type titanium oxide grains according to the present invention. Examples of such inorganic pigment particles include silica, alumina, kaolin, clay, zinc oxide, calcium carbonate, barium carbonate, calcium sulfate, barium sulfate, magnesium carbonate, and titanium oxide having a crystal structure other than the anatase type. The inorganic pigment particles are used preferably less than 40 parts by weight, more preferably not more than 30 parts by weight, based on 100 parts by weight of the anatase-type titanium oxide grains according to the present invention.

The light-sensitive layer contains the fine anatase-type titanium oxide grains preferably in a range of from 30 to 95% by weight, more preferably in a range of from 50 to 80% by weight in order to well utilize the effect of the fine anatase-type titanium oxide grains. In the above described range, the surface of the light-sensitive layer is occupied with the anatase-type titanium oxide grains sufficient for obtaining the desired hydrophilicity upon the ultraviolet ray exposure. When the content of the anatase-type titanium oxide grains is less than 30% by weight, the surface of the light-sensitive layer may not become sufficiently hydrophilic. On the other hand, the content exceeds 95% by weight, the light-sensitive layer tends to become brittle.

The light-sensitive layer which is provided on a support of the lithographic printing plate precursor according to the present invention contains, as the main components, the anatase-type titanium oxide grains and a binder resin comprising a complex composed of an organo-metallic polymer and an organic polymer containing an amido bond, a urethane bond, a ureido bond or a hydroxy group.

The organo-metallic polymer means a polymer mainly containing a bond of "oxygen atom-metallic atom-oxygen atom".

The term "amido bond" used with respect to the organic polymer herein includes a carboxylic amido bond and a sulfonamido bond, and the carboxylic ido bond includes not only an

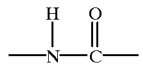

bond but also an

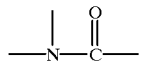

bond. The term "complex composed of an organo-metallic polymer and an organic polymer" includes both a sol substance and a gel substance.

The organo-metallic polymer used in the present invention is preferably a polymer obtained by a hydrolysis reaction and a polymerization condensation reaction of an organo-metallic compound represented by formula (I) shown below. The organo-metallic compounds may be used individually or as a mixture of two or more thereof.

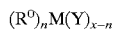
(I)

wherein $R^0$ represents a hydrogen atom, a hydrocarbon group or a heterocyclic group; Y represents a reactive group; M represents a metallic atom having from 3 to 6 valences; x represents a valence of the metallic atom M; and n represents 0, 1, 2 3 or 4, provided that the balance of x−n is not less than 2.

In formula (I), the hydrocarbon group represented by $R^0$ preferably includes an unsubstituted or substituted, straight chain or branched chain alkyl group having from 1 to 12 carbon atoms [e.g., methyl, ethyl, propyl, butyl, pentyl, hexyl, heptyl, octyl, nonyl, decyl and dodecyl groups, which each may have one or more substituents, such as a halogen atom (e.g., chlorine, fluorine or bromine atom), a hydroxy group, a thiol group, a carboxy group, a sulfo group, a cyano group, an epoxy group, an —OR' group (wherein R' represents a hydrocarbon group, e.g., methyl, ethyl, propyl, butyl, heptyl, hexyl, octyl, decyl, propenyl, butenyl, hexenyl, octenyl, 2-hydroxyethyl, 3-chloropropyl, 2-cyanoethyl, N,N-dimethylaminoethyl, 2-bromoethyl, 2-(2-methoxyethyl)oxyethyl, 2-methoxycarbonylethyl, 3-carboxypropyl or benzyl), an —OCOR" group (wherein R" has the same meaning as R'), a —COOR" group, a —COR" group, an —N(R''')$_2$ group (wherein R''', which may be the same or different, each represents a hydrogen atom or a group same as defined for R', an —NHCONHR" group, an —NHCOOR" group, a —Si(R")$_3$ group, a —CONHR''' group and a —NHCOR" group]; an unsubstituted or substituted, straight chain or branched chain alkenyl group having from 2 to 12 carbon atoms [e.g., vinyl, propenyl, butenyl, pentenyl, hexenyl, octenyl, decenyl and dodecenyl groups, which each may have one or more substituents selected from those described for the foregoing alkyl group]; an unsubstituted or substituted aralkyl group having from 7 to 14 carbon atoms [e.g., benzyl, phenetyl, 3-phenylpropyl, naphthylmethyl and 2-naphthylethyl groups, which each may have one ore more substituents selected from those described for the foregoing alkyl group]; an unsubstituted or substituted alicyclic group having from 5 to 10 carbon atoms [e.g., cyclopentyl, cyclohexyl, 2-cyclohexylethyl, 2-cyclopentylethyl, norbornyl and adamantyl groups, which each may have one or more substituents selected from those described for the foregoing alkyl group]; and an unsubstituted or substituted aryl group having 6 to 12 carbon atoms [e.g., phenyl and naphthyl groups, which each may have one or more substituents selected from those described for the foregoing alkyl group]. The heterocyclic group represented by $R^0$ preferably includes an unsubstituted or substituted heterocyclic group which may have a condensed ring, containing at least one atom selected from nitrogen, oxygen and sulfur atoms [examples of the hetero ring include pyran, furan, thiophene, morpholine, pyrrole, thiazole, oxazole, pyridine, piperidine, pyrrolidone, benzothiazole, benzoxazole, quinoline and tetrahydrofuran rings, which each may have one or more substituents selected from those described for the foregoing alkyl group].

Preferred examples of the reactive group represented by Y in formula (I) include a hydroxy group, a halogen atom (e.g., fluorine, chlorine, bromine or iodine atom), an —OR$^1$ group, an —OCOR$^2$ group, a —CH(COR$^3$)(COR$^4$) group, a —CH(COR$^3$)(COOR$^4$) group or an —N(R$^5$)(R$^6$) group.

In the group of —OR$^1$, R$^1$ represents an unsubstituted or substituted aliphatic group having from 1 to 10 carbon atoms (e.g., methyl, ethyl, propyl, butyl, pentyl, hexyl, heptyl, octyl, nonyl, decyl, propenyl, butenyl, heptenyl, hexenyl, octenyl, decenyl, 2-hydroxyethyl, 2-hydroxypropyl, 2-methoxyethyl, 2-(methoxyethoxy)ethyl, 2-(N,N-diethylamino)ethyl, 2-methoxypropyl, 2-cyanoethyl, 3-methoxypropyl, 2-chloroethyl, cyclohexyl, cyclopentyl, cyclooctyl, chlorocyclohexyl, methoxycyclohexyl, benzyl, phenetyl, dimethoxybenzyl, methylbenzyl, or bromobenzyl).

In the group of —OCOR², R² represents an aliphatic group same as defined for R¹, or an unsubstituted or substituted aromatic group having from 6 to 12 carbon atoms (e.g., aryl groups same as described for the forgoing R⁰).

In the group of —CH(COR³)(COR⁴) or the group of —CH(COR³)(COOR⁴), R³ represents an alkyl group having from 1 to 4 carbon atoms (e.g., methyl, ethyl, propyl or butyl) or an aryl group (e.g., phenyl, tolyl or xylyl), and R⁴ represents an alkyl group having from 1 to 6 carbon atoms (e.g., methyl, ethyl, propyl, butyl, pentyl or hexyl), an aralkyl group having from 7 to 12 carbon atoms (e.g., benzyl, phenethyl, phenylpropyl, methylbenzyl, methoxybenzyl, carboxybenzyl or chlorobenzyl) or an aryl group (e.g., phenyl, tolyl, xylyl, mesityl, methoxyphenyl, chlorophenyl, carboxyphenyl or diethoxyphenyl).

In the group of —N(R⁵)(R⁶), R⁵ and R⁶, which may be the same or different, each represents a hydrogen atom or an unsubstituted or substituted aliphatic group having from 1 to 10 carbon atoms (e.g., aliphatic groups same as described for R¹ in the foregoing group of —OR¹). More preferably, the total number of carbon atoms contained in R⁵ and R⁶ are 12 or less.

Preferred examples of the metallic atom represented by M include metallic atoms of transition metals, rare earth metals and metals of III to V groups of periodic table. More preferred metals include Al, Si, Sn, Ge, Ti and Zr, and still more preferred metals include Al, Si, Sn, Ti and Zr. Particularly, Si is preferred.

Now, the organic polymer used in the present invention will be described in more detail below.

The organic polymer is characterized by containing at least one member selected from the group consisting of an amido bond, a urethane bond, a ureido bond and a hydroxy group, and includes a polymer containing, as a repeating unit component, a component having at least one bond selected from —N(R¹⁰)CO—, —N(R¹⁰)SO₂—, —NHCONH— and —NHCOO— in the main chain or side chain thereof, and a polymer containing, as a repeating unit component, a component having a hydroxy group. In the above-described amido bonds, R¹⁰ represents a hydrogen atom or an organic residue, and the organic residue includes a hydrocarbon group and a heterocyclic group same as described for R⁰ in formula (I).

The organic polymer containing the specific bond in its main chain according to the present invention includes an amide resin having the —N(R¹⁰)CO— or —N(R¹⁰)SO₂— bond, a ureido resin having the —NHCONH— bond, and a urethane resin having the —NHCOO— bond.

As diamines and dicarboxylic acids used for preparation of the amide resins, diisocyanates used for preparation of the ureido resins and diols used for preparation of the urethane resins, compounds described, for example, in *Polymer Data Handbook, Fundamental Volume*, Chapter I, edited by Polymer Science Society, Baifukan (1986) and *Handbook of Cross-linking Agents*, edited by Shinzo Yamashita and Tosuke Kaneko, Taiseisha (1981).

Other examples of the polymer containing the amido bond include a polymer containing a repeating unit represented by formula (II) shown below, N-acylated polyalkyleneimine, and polyvinylpyrrolidone and derivatives thereof.

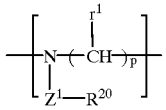

(II)

wherein, Z¹ represents —CO— or —CS—; R²⁰ represents a hydrogen atom, a hydrocarbon group or a heterocyclic group (the hydrocarbon group and heterocyclic group having the same meanings as those defined for R⁰ in formula (I), respectively); r¹ represents hydrogen atom or an alkyl group having from 1 to 6 carbon atoms (e.g., methyl, ethyl, propyl, butyl, pentyl or hexyl), r¹s may be the same or different; and p represents an integer of 2 or 3.

Among the polymers containing a repeating unit represented by formula (II), a polymer wherein Z¹ represents —CO— and p is 2 can be obtained by ring-opening polymerization of oxazoline which may be substituted in the presence of a catalyst. The catalyst which can be used includes a sulfuric ester or sulfonic ester (e.g., dimethyl sulfate or an alkyl p-toluenesulfonate), an alkyl halide (e.g., an alkyl iodide such as methyl iodide), a fluorinated metallic compound of Friedel-Crafts catalyst, and an acid (e.g., sulfuric acid, hydrogen iodide or p-toluenesulfonic acid) or an oxazolinium salt thereof formed from the acid and oxazoline.

The polymer may be a homopolymer or a copolymer. The polymer also includes a graft polymer containing the units derived from oxazoline in its graft portion.

Specific examples of the oxazoline include 2-oxazoline, 2-methyl-2-oxazoline, 2-ethyl-2-oxazoline, 2-propyl-2-oxazoline, 2-isopropyl-2-oxazoline, 2-butyl-2-oxazoline, 2-dichloromethyl-2-oxazoline, 2-trichloromethyl-2-oxazoline, 2-pentafluoroethyl-2-oxazoline, 2-phenyl-2-oxazoline, 2-methoxycarbonylethyl-2-oxazoline, 2-(4-methylphenyl)-2-oxazoline, and 2-(4-chlorophenyl)-2-oxazoline. Preferred examples of the oxazoline include 2-oxazoline, 2-methyl-2-oxazoline, 2-ethyl-2-oxazoline. The oxazoline polymers may be employed individually or as a mixture of two or more thereof.

Other polymers containing a repeating unit represented by formula (II) are also obtained in the same manner as described above except for using thiazoline, 4,5-dihydro-1,3-oxazine or 4,5-dihydro-1,3-thiazine in place of oxazoline.

The N-acylated polyalkyleneimine includes a carboxylic amide compound containing an —N(CO—R²⁰)— bond obtained by a polymer reaction of polyalkyleneimine with a carboxylic halide and a sulfonamide compound containing an —N(SO₂—R²⁰)— bond obtained by a polymer reaction of polyalkyleneimine with a sulfonyl halide.

The organic polymer containing the specific bond in the side chain thereof according to the present invention includes a polymer containing as the main component, a component having at least one bond selected from the specific bonds.

Specific examples of the component having the specific bond include repeating units derived from acrylamide, methacrylamide, crotonamide and vinyl acetamide, and the repeating units shown below, but the present invention should not be construed as being limited thereto.

(1)

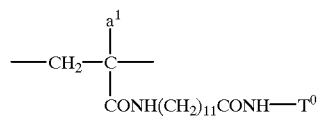

a¹: —H, —CH₃
l₁: an integer from 1 to 4
T⁰: —H, —CH₃, —(CH₂)₂OCH₃,
—(CH₂)₂N(CH₃)₂

(2)

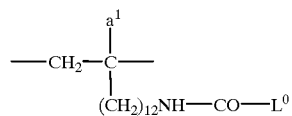

l₂: 0 or 1
L⁰: —C$_{nl}$H$_{2nl+1}$
(n₁: an integer from 1 to 4)
—(CH₂)₂OCH₃, —(CH₂)₃N(CH₃)₂
—CH₂C₆H₅, —(CH₂)$_{nl}$OH (3)

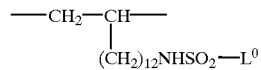

(4)

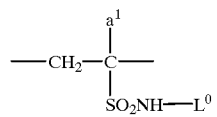

(5)

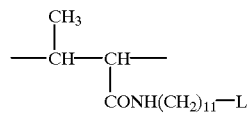

(6)

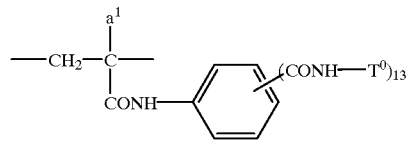

l₃: 0, 1 or 2

(7)

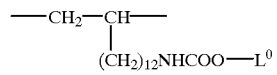

(8)

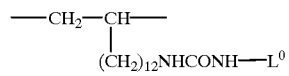

(9)

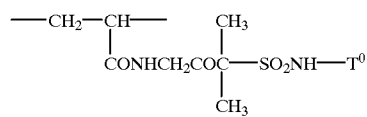

(10)

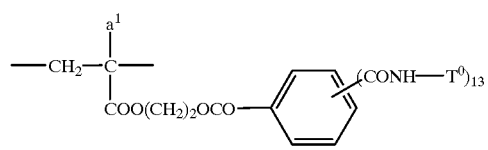

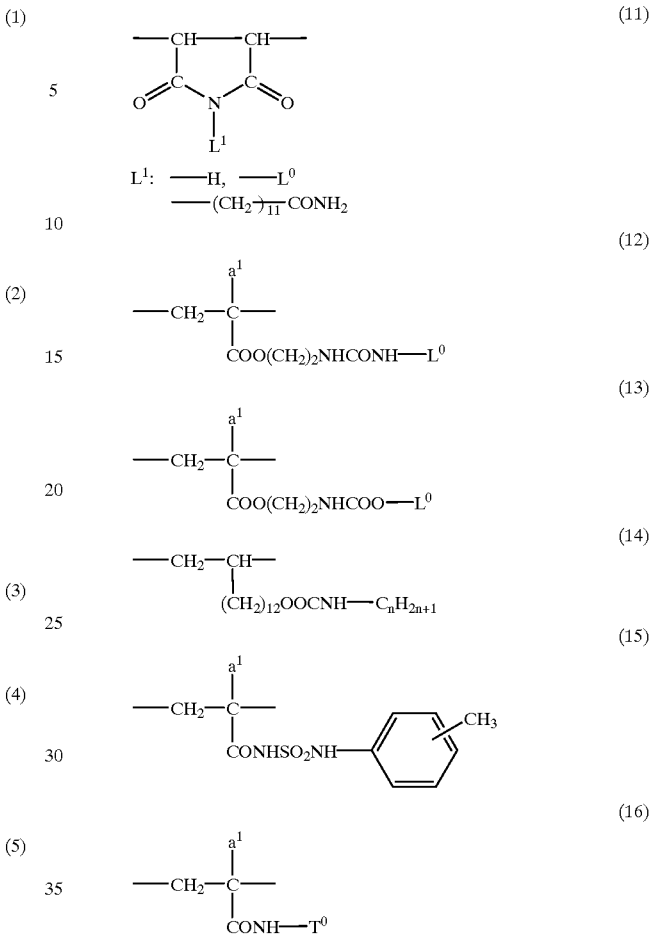

(11)

L¹: —H, —L⁰
—(CH₂)$_{\overline{11}}$CONH₂

(12)

(13)

(14)

(15)

(16)

The organic polymer containing a hydroxy group according to the present invention may be any of natural water-soluble polymers, semisynthetic water-soluble polymers and synthetic water-soluble polymers, and include those described, for example, in *Water-Soluble Polymers Aqueous Dispersion Type Resins: Collective Technical Data*, Keiei Kaihatsu Center Publishing Division (1981), Sinji Nagatomo, *New Applications and Market of Water-Soluble Polymers*, CMC (1988), and *Development of Functional Cellulose*, CMC (1985).

Specific examples of the natural and semisynthetic water-soluble polymers include cellulose, cellulose derivatives (e.g., cellulose esters such as cellulose nitrate, cellulose sulfate, cellulose acetate, cellulose propionate, cellulose succinate, cellulose butyrate, cellulose acetate succinate, cellulose acetate butyrate or cellulose acetate phthalate; and cellulose ethers such as methylcellulose, ethylcellulose, cyanoethylcellulose, carboxymethylcellulose, hydroxyethylcellulose, hydroxypropylcellulose, ethyl hydroxyethylcellulose, hydroxypropyl methylcellulose or carboxymethyl hydroxyethylcellulose), starch, starch derivatives (e.g., oxidized starch, esterified starch including those esterified with an acid such as nitric acid, sulfuric acid, phosphoric acid, acetic acid, propionic acid, butyric acid or succinic acid; and etherified starch such as methylated starch, ethylated starch, cyanoethylated starch, hydroxyalkylated starch or carboxymethylated starch), alginic acid, pectin, carrageenan, tamarind gum, natural rubber (e.g., gum arabic, guar gum, locust bean gum, tragacanth gum or xanthane gum), pullulan, dextran, casein, gelatin, chitin and chitosan.

Specific examples of the synthetic water-soluble polymer include polyvinyl alcohol, polyalkylene glycols (e.g., polyethylene glycol, polypropylene glycol or ethylene glycol/propylene glycol copolymers), allyl alcohol copolymers, homopolymers or copolymers of acrylate or methacrylate containing at least one hydroxy group (examples of ester portion including a 2-hydroxyethyl, 3-hydroxypropyl, 2,3-dihydroxypropyl, 3-hydroxy-2-hydroxy-methyl-2-methylpropyl, 3-hydroxy-2,2-di(hydroxymethyl)-propyl, polyoxyethylene and polyoxypropylene group), homopolymers or copolymers of N-substituted acrylamide or methacrylamide containing at least one hydroxy group (examples of N-substituent including a monomethylol, 2-hydroxyethyl, 3-hydroxypropyl, 1,1-bis(hydroxymethyl)ethyl and 2,3,4,5,6-pentahydroxypentyl group). However, the synthetic water-soluble polymer is not particularly limited as long as it contains at least one hydroxy group in the side chain substituent of the repeating unit thereof.

The weight average molecular weight of the organic polymer constituting the complex used in the light-sensitive layer according to the present invention is preferably from $1 \times 10^3$ to $1 \times 10^6$, more preferably from $5 \times 10^3$ to $4 \times 10^5$.

In the complex composed of an organo-metallic polymer and an organic polymer according to the present invention, a ratio of the organo-metallic polymer to the organic polymer can be selected from a wide range, and a weight ratio of organo-metallic polymer/organic polymer is preferably from 10/90 to 90/10, more preferably from 20/80 to 80/20.

In such a range, the desired film-strength and dampening water-resistance of the light-sensitive layer during printing are advantageously effected.

The binder resin comprising the complex of organo-metallic polymer and organic polymer according to the present invention forms a uniform organic/inorganic hybrid by means of the function of hydrogen bonds generated between hydroxy groups of the organo-metallic polymer produced by the hydrolysis polymerization condensation of the organo-metallic compounds as described above and the above described specific bonds or hydroxy groups in the organic polymer and is microscopically homogeneous without the occurrence of phase separation. Also, it is believed that the affinity between the organo-metallic polymer and the organic polymer is more improved because of the function of the hydrocarbon group included in the organo-metallic polymer. Further, the complex of the organo-metallic polymer and the organic polymer is excellent in a film-forming property.

The complex of resins can be prepared by subjecting the organo-metallic compound to the hydrolysis polymerization condensation and then mixing with the organic polymer, or by conducting the hydrolysis polymerization condensation of the organo-metallic compound in the presence of the organic polymer.

Preferably, the complex of organo-metallic polymer and organic polymer according to the present invention is prepared by conducting the hydrolysis polymerization condensation of the organo-metallic compound in the presence of the organic polymer according to a sol-gel method. In the complex of polymers thus prepared, the organic polymer is uniformly dispersed in a matrix (i.e., three-dimensional micro-network structure of inorganic metal oxide) of gel prepared by the hydrolysis polymerization condensation of the organo-metallic compound.

The sol-gel method in the present invention may be performed according to any of conventionally well-known sol-gel methods. More specifically, it is conducted with reference to methods described in detail, for example, in *Thin Film Coating Technology by Sol-Gel Method*, Gijutsu-joho Kyokai (1995), Sumio Sakibana, *Science of Sol-Gel Method*, Agne Shofusha (1988), and Seki Hirashima, *Latest Technology of Functional Thin Film Formation by Sol-Gel Method*, Sogo Gijutu Center (1992).

As a coating solution for the light-sensitive layer, an aqueous solvent is preferably used. A water-soluble solvent is also employed together therewith in order to prevent precipitation during the preparation of coating solution, thereby forming a homogenous solution. Examples of such a water-soluble solvent include an alcohol (such as methanol, ethanol, propyl alcohol, ethylene glycol, diethylene glycol, propylene glycol, dipropylene glycol, ethylene glycol monomethyl ether, propylene glycol monomethyl ether and ethylene glycol monoethyl ether), an ether (such as tetrahydrofuran, ethylene glycol dimethyl ether, propylene glycol dimethyl ether and tetrahydrofuran), a ketone (such as acetone, methyl ethyl ketone and acetylacetone), an ester (such as methyl acetate and ethylene glycol monomethylmonoacetate) and an amide (such as formamide, N-methylformamide, pyrrolidone and N-methylpyrrolidone). These solvents may be used individually or as a mixture of two or more thereof.

In the coating solution, it is preferred to further use an acidic or basic catalyst for the purpose of accelerating the hydrolysis and polymerization condensation reaction of the organo-metallic compound represented by formula (I).

The catalyst used for the above purpose is an acidic or basic compound itself or an acidic or basic compound dissolved in a solvent, such as water or an alcohol (such a compound is hereinafter referred to as an acidic catalyst or a basic catalyst respectively). The concentration of catalyst is not particularly limited, but the high catalyst concentration tends to increase the hydrolysis speed and the polymerization condensation speed. However, since the basic catalyst used in a high concentration may cause precipitation in the sol solution, it is desirable that the basic catalyst concentration be not higher than one normal (1N), as a concentration in the aqueous solution.

The acidic catalyst or the basic catalyst used has no particular restriction as to the species. In a case where the use of a catalyst in a high concentration is required, however, a catalyst constituted of elements which leave no residue in crystal grains obtained after sintering is preferred. Suitable examples of the acidic catalyst include a hydrogen halide (e.g., hydrogen chloride), nitric acid, sulfuric acid, sulfurous acid, hydrogen sulfide, perchloric acid, hydrogen peroxide, carbonic acid, a carboxylic acid (e.g., formic acid or acetic acid), a substituted carboxylic acid (e.g., an acid represented by formula of RCOOH wherein R is an element or a substituent other than —H and $CH_3$—), and a sulfonic acid (e.g., benzenesulfonic acid). Suitable examples of the basic catalyst include an ammoniacal base (e.g., aqueous ammonia) and an amine (e.g., ethylamine or aniline).

A ratio of binder resin/total pigment particle (including the anatase-type titanium oxide grains and other inorganic pigment particles added, if desired) in the light-sensitive layer is preferably from 8/100 to 50/100 by weight, more preferably from 10/100 to 30/100 by weight. In such a range, the effects of the present invention are efficiently achieved, and the film-strength can be retained and the good hydrophilicity in the exposed area formed by irradiation with an ultraviolet ray can be maintained during printing.

To the light-sensitive layer, a cross-linking agent may be added for increasing the film-strength thereof.

The cross-linking agent usable herein include compounds ordinarily used as cross-linking agent. Specifically, such compounds as described, e.g., in *Handbook of Cross-linking Agents*, edited by Shinzo Yamashita and Tosuke Kaneko, Taiseisha (1981) and *Polymer Data Handbook*, Fundamental Volume, edited by Polymer Science Society, Baifukan (1986) are employed.

Examples of cross-linking agent which can be used include ammonium chloride, metal ions, organic peroxides, polyisocyanate compounds (e.g., toluylene diisocyanate, diphenylmethane diisocyanate, triphenylmethane triisocyanate, polymethylene phenylisocyanate, hexamethylene diisocyanate, isophorone diisocyanate, or high molecular polyisocyanate), polyol compounds (e.g., 1,4-butanediol, polyoxypropylene glycol, polyoxyethylene glycol, or 1,1,1-trimethylolpropane), polyamine compounds (e.g., ethylenediamine, $\mu$-hydroxypropylated ethylenediamine, phenylenediamine, hexamethylenediamine, N-aminoethylpiperazine, or modified aliphatic polyamines), polyepoxy group-containing compounds and epoxy resins (e.g., compounds described in Hiroshi Kakiuchi, *New Epoxy Resins*, Shokodo (1985), and Kuniyuki Hashimoto, *Epoxy Resins*, Nikkan Kogyo Shinbunsha (1969)), melamine resins (e.g., compounds described in Ichiro Miwa & Hideo Matsunaga, *Ure-aMelamine Resins*, Nikkan Kogyo Shinbunsha (1969)), and poly(meth)acrylate compounds (e.g., compounds described in Makoto Ogawara, Takeo Saegusa & Toshinobu Higashimura, Oligomers, Kodansha (1976), and Eizo Omori, *Functional Acrylic Resins*, Techno System (1985))

The thus prepared coating solution is coated on a support using any of conventionally well-known coating methods, and dried to form the light-sensitive layer.

The thickness of the light-sensitive layer formed is preferably from 0.2 to 10 $\mu$m, more preferably from 0.5 to 8 $\mu$m. In such a thickness range, the layer formed can have a uniform thickness and sufficient film-strength.

Examples of the support usable in the present invention include an aluminum plate, a zinc plate, a bimetal plate such as a copper-aluminum plate, a copper-stainless steel plate or a chromium-copper plate, and a trimetal plate such as a chromium-copper-aluminum plate, chromium-lead-iron plate or a chromium-copper-stainless steel plate, which each has a thickness of preferably from 0.1 to 3 mm, more preferably from 0.1 to 1 mm. Also, paper subjected to water-resistant treatment, paper laminated with a plastic film or a metal foil, and a plastic film each preferably having a thickness of from 80 to 200 $\mu$m are employed.

The support used has preferably a highly smooth surface. Specifically, it is desirable for the support used in the present invention that the Bekk smoothness on the surface side which is contact with the light-sensitive layer be adjusted to preferably at least 300 (sec/10 ml), more preferably from 900 to 3,000 (sec/10 ml), still more preferably from 1,000 to 3,000 (sec/10 ml). By controlling the Bekk smoothness of the surface side of the support which is contact with the light-sensitive layer to at least 300 sec/10 ml, the image reproducibility and the press life can be more improved. As such improving effects can be obtained even when the light-sensitive layer having the same surface smoothness is used, the increase in the smoothness of the support surface is considered to increase the adhesion between the support and the light-sensitive layer.

The term "Bekk smoothness" as used herein means a Bekk smoothness degree measured by a Bekk smoothness tester. In the Bekk smoothness tester, a sample piece is pressed against a circular glass plate having a highly smooth finish and a hole at the center while applying thereto a definite pressure (1 kg/cm$^2$), and a definite volume (10 ml) of air is forced to pass between the sample piece and the glass surface under reduced pressure. Under this condition, a time (expressed in second) required for the air passage is measured.

The expression "highly smooth surface of the support" as used herein means a surface on which the light-sensitive layer is directly provided. In other words, when the support has an under layer, the highly smooth surface denotes the surface of the under layer.

Thus, the surface condition of the light-sensitive layer can be controlled and fully kept without receiving the influence of surface roughness of the support used. As a result, it becomes possible to further improve the image quality.

The adjustment of the surface smoothness to the above described range can be made using various well-known methods. For instance, the Bekk smoothness of support surface can be adjusted by coating a substrate with a resin using a melt adhesion method, or by using a strengthened calender method utilizing highly smooth heated rollers.

For preventing the printing plate precursor from curling, the support may have a backcoat layer (backing layer) on the side opposite to the light-sensitive layer. It is preferred that the backcoat layer has the Bekk smoothness of 150 to 700 (sec/10 ml).

In order to conduct image formation on the printing plate precursor according to the present invention, the surface of the light-sensitive layer of the printing plate precursor is directly exposed imagewise to an ultraviolet ray, whereby the exposed area is converted to the hydrophilic condition and forms a non-image portion. On the other hand, the unexposed area maintains its hydrophobic condition and constitutes an image portion for accepting ink. For the purpose of ultraviolet ray exposure, a laser beam, for example, XeF excimer, He—Cd, $N_2$, or 4th harmonic wave of diode pumped Nd;YAG by OPO using BBO crystal is employed.

The light sensitive layer of the lithographic printing plate precursor is inherently hydrophobic as described above. A contact angle of the surface of the light-sensitive layer with water in the unexposed area (image portion) is ordinarily 20 degrees or more, preferably from 40 to 110 degrees, and more preferably from 50 to 95 degrees. On the other hand, in the exposed area (non-image portion) the contact angle of the surface of the light-sensitive layer with water is ordinarily 10 degrees or less, preferably 5 degrees or less.

The contact angle of the surface of the light-sensitive layer with water is determined in the following manner. Two $\mu$l of distilled water is put on the surface of the light-sensitive layer at room temperature (from 15 to 35° C.) and 30 seconds after, the contact angle of the surface of the light-sensitive layer with water is measured by a surface contact meter (CA-D manufactured by Kyowa Kaimen Kagaku Co., Ltd.). The contact angle with water described in the specification is determined in the above manner.

The lithographic printing plate thus-obtained is mounted on a conventional offset printing machine to perform printing. Dampening water and printing ink used can be appropriately selected from those conventionally employed in the field of offset printing depending on the purpose.

According to the present invention, the lithographic printing plate can be reused. More specifically, after the completion of printing, printing ink is removed from the surface of the printing plate by an appropriate method, for example, wiping the surface with a conventional ink-removing cleaner, and then the printing plate is subjected to heat treatment preferably at temperature of from 130 to 200° C. for a period of from 1 to 5 hours, more preferably at temperature of from 150 to 200° C. for a period of from 1 to 3 hours, whereby the hydrophilic non-image portion returns to the inherent hydrophobic state. The resulting printing plate precursor is repeatedly employed for plate-making and printing.

Further, the light-sensitive layer of the lithographic printing plate precursor according to the present invention has strength sufficient for making resistance against wear and tear and enough difference in wettability between the image portion and the non-image portion and thus, after printing about 10,000 sheets is repeated 10 times, prints having clear images without background stain can be obtained.

According to the method for the preparation of a lithographic printing plate of the present invention, image formation and dry type desensitizing treatment can be conducted at once in a simple manner only by ultraviolet ray imagewise exposure of the lithographic printing plate precursor comprising a light-sensitive layer containing fine anatase-type titanium oxide grains and a resin of the complex composed of an organo-metallic polymer and a specific organic polymer, and no development processing is necessary to prepare a lithographic printing plate which provides a large number of prints having clear images without background stain by printing using conventional printing ink and dampening water.

Moreover, since toner or ink is not employed for the image formation of the lithographic printing plate according to the present invention, a lithographic printing plate is regenerated by removing printing ink from the surface thereof and subjecting to heat treatment to return the hydrophilic non-image portion to the inherent hydrophobic state.

The present invention will be described in greater detail with reference to the following examples, but the present invention should not be construed as being limited thereto.

EXAMPLE 1

Preparation of Lithographic Printing Plate Precursor
Coating Composition for Light-Sensitive Layer To 143 g of a 7% by weight aqueous solution of polyvinyl alcohol (PVA-405 produced by Kuraray Co., Ltd.) was added 57 g of methanol with stirring and the mixture was further stirred for 30 minutes. To the mixture was added 10 g of tetramethoxysilane, followed by stirring for 30 minutes, then one ml of concentrated hydrochloric acid was added thereto and the mixture was stirred for 2 hours and further allowed to stand for 24 hours.

To the resulting mixture were added 100 g of a 40% solution of photocatalyst titanium oxide sol (Titanium oxide slurry STS-21 produced by Ishihara Sangyo Kaisha Ltd.) and 48 g of a 20% solution of Alumina sol 520 (produced by Nissan Chemical Industries, Ltd.) and the mixture was stirred for 20 minutes to prepare a dispersion.

A support of ELP-1X Type Master (trade name, produced by Fuji Photo Film Co., Ltd.) having the Bekk smoothness of 900 (sec/10 ml) on the under layer side, which is used as an electrophotographic lithographic printing plate precursor for small-scale commercial printing, was employed. On the support, the coating composition prepared above was coated by means of a wire bar and dried at 110° C. for 20 minutes to form a light-sensitive layer having a coating amount of 1 g/m². Thus, a lithographic printing plate water with precursor was prepared.

The contact angle of the surface of the lithographic printing plate precursor with water was measured according to the method described hereinbefore and the value obtained was 55 degrees.

The lithographic printing plate precursor was directly exposed using a writing device having an He—Cd laser beam as a light source (50 mW; beam diameter: 20 µm; drum type) at a writing speed of 3 mm/sec to form an image.

The surface wettabilities of the non-image portion and the image portion (solid image portion) of the thus obtained lithographic printing plate were evaluated by the contact angle with water. The contact angle of the surface of the non-image portion which had been exposed with the laser beam with water was changed to 0 degree, and on the other hand, that of the image portion was 55 degrees which was the same as before the exposure.

The lithographic printing plate was mounted on a printing machine (Oliver Model 94 manufactured by Sakurai Seisakusho K.K.) and printing was performed on usual printing paper using black ink for offset printing and dampening water prepared by diluting SLM-OD (manufactured by Mitsubishi Paper Mills, Ltd.) 100 times with distilled water and placed in a dampening saucer.

The 10th print was picked up and the printed image thereon was visually observed using a magnifier of 20 magnifications. It was found that the non-image portion was free from background stain resulting from adhesion of printing ink and the uniformity of the solid image portion was highly satisfactory. Further, as a result of investigation of the print under an optical microscope of 200 magnifications, narrowing or cutting of fine lines and letters were not recognized and the image quality was excellent.

In the printing operations, more than 10,000 prints having the image quality equal to that of the 10th print were obtained.

EXAMPLES 2 TO 8

Each lithographic printing plate precursor was prepared in the same manner as in Example 1 except for using the respective compounds shown in Table 1 below in place of polyvinyl alcohol (PVA-405) and tetramethoxysilane in the complex for the binder resin used in Example 1.

TABLE 1

| Example | Organo-Metallic Compound/Organic Polymer | A | B |
|---|---|---|---|
| 2 | Tetraethoxysilane[1)]/PVA-405[2)] (10 g/10 g) | 55 | 0 |
| 3 | Methyltrimethoxysilane[1)]/PVA-405[2)] (10 g/10 g) | 70 | 0 |
| 4 | Tetramethoxysilane[1)]/PVA-205[2)] (10 g/10 g) | 70 | 0 |
| 5 | Tetramethoxysilane[1)]/Acrylamide[3)] (10 g/10 g) | 75 | 0 |
| 6 | Phenyltrimethoxysilane[1)]/Vinyl Pyrrolidone[3)] (10 g/10 g) | 85 | 5 |
| 7 | Tetraethoxysilane[1)]/Gelatin[3)] (10 g/10 g) | 75 | 0 |
| 8 | Trimethoxysilane[1)]/Gelatin[3)] (10 g/10 g) | 80 | 0 |

A Contact angle of the surface of the image portion with water
B Contact angle of the surface of the non-image portion with water after the exposure
[1)]produced by Shin-Etsu Chemical Co., Ltd.
[2)]produced by Kuraray Co., Ltd.
[3)]produced by Wako Pure Chemical Industries, Ltd.

A: Contact angle of the surface of the image portion with water
B: Contact angle of the surface of the non-image portion with water after the exposure
1): produced by Shin-Etsu Chemical Co., Ltd.
2): produced by Kuraray Co., Ltd
3): produced by Wako Pure Chemical Industries, Ltd.

The image formation and offset printing were conducted in the same manner as in Example 1. The contact angle of the surface of the light-sensitive layer of each lithographic printing plate obtained with water was in a range of from 55 to 85 degrees and the contact angle of the surface of the light-sensitive layer with water after the irradiation of light (imagewise exposure same as in Example 1) was 5 degrees or less.

The prints thus obtained had clear images without background stain in the non-image portion similar to those obtained in Example 1, and the printing durability (i.e., press life) was good as 10,000 prints or more.

EXAMPLE 9

Preparation of Lithographic Printing Plate Precursor Coating Composition for Light-Sensitive Layer A composition having the following component was placed in a paint shaker (manufactured by Toyo Seiki Co., Ltd.) together with glass beads and dispersed for 10 minutes. Then, the glass beads were removed by filtration to obtain a dispersion.

| | |
|---|---|
| Photocatalyst titanium oxide powder (STS-01 produced by Ishihara Sangyo Kaisha Ltd.) | 45 g |
| Colloidal silica (20% dispersion, Snowtex C produced by Nissan Chemical Industries, Ltd.) | 25 g |
| Complex for binder resin shown below | 138.5 g |
| Water | 250 g |

Complex for binder resin:

To 100 g of a 10% by weight aqueous solution of succinic acid-modified starch (PENON-F3 produced by Nichiden Chemical Co., Ltd.) was added 28.5 g of methanol and the mixture was stirred for 30 minutes. To the mixture was added 10 g of tetraethoxysilane, followed by stirring for 30 minutes, then one ml of concentrated hydrochloric acid was added thereto and the mixture was stirred for 6 hours and further allowed to stand for 24 hours.

The dispersion was coated on a support for ELP-II Type Master (manufactured by Fuji Photo Film Co., Ltd.) used as an electrophotographic lithographic printing plate precursor for small-scale commercial printing using a wire bar and dried at 110° C. for 20 minutes to form a light-sensitive layer having a coating amount of 5 g/m², thereby obtaining a lithographic printing plate precursor.

The contact angle of the surface of the lithographic printing plate precursor with water was 55 degrees.

The image formation and offset printing were conducted in the same manner as in Example 1.

The prints thus obtained had clear images without background stain in the non-image portion similar to those obtained in Example 1, and the printing durability was good as 10,000 prints or more.

EXAMPLES 10 TO 12

Preparation of Lithographic Printing Plate Precursor

Lithographic printing plate precursors were prepared in the same manner as in Example 9 except for changing the mixing ratio of the titanium oxide powder to the complex for binder resin to those shown in Table 2 below, respectively.

TABLE 2

| Example | Mixing Ratio of Titanium Oxide Powder/ Complex for Binder Resin (% by weight) | A | B |
|---|---|---|---|
| 10 | 50/50 | 55 | 0 |
| 11 | 85/15 | 70 | 0 |
| 12 | 30/70 | 60 | 0 |

A Contact angle of the surface of the image portion with water
B Contact angle of the surface of the non-image portion with water after the exposure A: Contact angle of the surface of the image portion with water
B: Contact angle of the surface of the non-image portion with water after the exposure The image formation and offset printing were conducted in the same manner as in Example 1.

The contact angle of the surface of the light-sensitive layer of each lithographic printing plate obtained with water was in a range of from 55 to 70 degrees and the contact angle of the surface of the light-sensitive layer with water after the irradiation of light (imagewise exposure same as in Example 1) was 0 degree.

The prints thus obtained had clear images without background stain in the non-image portion similar to those obtained in Example 9, and the printing durability was good as 10,000 prints or more.

EXAMPLE 13

Preparation of Lithographic Printing Plate Precursor Coating Composition for Light-Sensitive Layer A composition having the following component was placed in a paint shaker (manufactured by Toyo Seiki Co., Ltd.) together with glass beads and dispersed for 10 minutes. Then, the glass beads were removed by filtration to obtain a dispersion.

| | |
|---|---|
| 40% Aqueous solution of photocatalyst titanium oxide sol (Titanium Oxide Slurry STS-02 produced by Ishihara Sangyo Kaisha Ltd.) | 100 g |
| Colloidal silica (20% Solution, Snowtex C, produced by Nissan Chemical Industries, Ltd.) | 25 g |
| Complex for binder resin shown below | 138.5 g |
| Water | 250 g |

Complex for binder resin:

To a mixture of 120 g of a 10% aqueous solution of polyethylene glycol 20000 (produced by Wako Pure Chemical Industries, Ltd.) and 30 g of methanol were added with stirring 6 g of tetraethoxysilane and 2 g of methyltrimethoxysilane, followed by stirring for 30 minutes, then one ml of concentrated hydrochloric acid was added thereto and the mixture was stirred for 4 hours and further allowed to stand for 24 hours.

The dispersion was coated on a degreased aluminum plate having a thickness of 150 μm using a wire bar and dried at 110° C. for 20 minutes to form a light-sensitive layer having a coating amount of 3 g/m², thereby obtaining a lithographic printing plate precursor.

The contact angle of the surface of the lithographic printing plate precursor with water was 60 degrees.

The lithographic printing plate precursor was subjected to the laser beam exposure in the same manner as in Example 1 to form an image. The contact angle of the surface of the exposed area (corresponding to the non-image portion) with water was changed to 0 degree, and that of the unexposed area was 60 degrees which was the same as before the exposure.

Then, the offset printing was conducted in the same manner as in Example 1. The prints thus obtained had clear images without background stain in the non-image portion similar to those obtained in Example 1, and the printing durability was good as 10,000 prints or more.

EXAMPLE 14

Preparation of Lithographic Printing Plate Precursor Coating Composition for Light-Sensitive Layer A composition having the following component was placed in a paint shaker (manufactured by Toyo Seiki Co., Ltd.) together with glass beads and dispersed for 10 minutes. Then, the glass beads were removed by filtration to obtain a dispersion.

| | |
|---|---|
| Photocatalyst titanium oxide powder (STS-01 produced by Ishihara Sangyo Kaisha Ltd.) | 45 g |
| 20% Solution of Alumina Sol 520 (produced by Nissan Chemical Industries, Ltd.) | 25 g |
| Complex for binder resin shown below | 138.5 g |
| Water | 230 g |

Complex for binder resin:

To 50 g of a tetrahydrofuran solution of poly(N-butanoylethyleneimine) was added 30 g of methanol and the mixture stirred for 10 minutes. To the mixture were added 5 g of tetraethoxysilane and 2.5 g of 3-sulfopropyl-trimethoxysilane, followed by stirring for 30 minutes, then 5 ml of 1N hydrochloric acid was added thereto and the mixture was stirred for 4 hours and further allowed to stand for 24 hours.

The dispersion was coated and dried in the same manner as in Example 13 to prepare a lithographic printing plate precursor.

The contact angle of the surface of the light-sensitive layer with water was 60 degrees.

The lithographic printing plate precursor was subjected to the laser beam exposure in the same manner as in Example 1 to form an image. The contact angle of the surface of the exposed area (corresponding to the non-image portion) with water was changed to 0 degree, and that of the unexposed area was 60 degrees which was the same as before the exposure.

Then, the offset printing was conducted in the same manner as in Example 1. The prints thus obtained had clear images without background stain in the non-image portion similar to those obtained in Example 1, and the printing durability was good as 10,000 prints or more.

Thereafter, the printing ink adhered to the image portion of the lithographic printing plate was removed using a conventional ink-removing cleaner, the printing plate was heated at 150° C. for one hour and allowed to cool to room temperature. The contact angle of the surface of the non-image portion with water returned to 60 degrees. The resulting lithographic printing plate precursor was subjected to the laser beam exposure in the same manner as in Example 1 to form an image. The contact angle of the surface of the exposed area (corresponding to the non-image portion) with water was changed to 0 degree, and that of the unexposed area was 60 degrees which was the same as before the exposure.

Then, the offset printing was conducted in the same manner as in Example 1. More than 10,000 prints having clear images without background stain in the non-image portion were obtained.

The procedures described above were repeated ten times in the same manner, and the good results similar to those at the first time were obtained.

While the invention has been described in detail and with reference to specific embodiments thereof, it will be apparent to one skilled in the art that various changes and modifications can be made therein without departing the spirit and scope thereof.

What is claimed is:

1. A method for the preparation of a lithographic printing plate comprises exposing imagewise a lithographic printing plate precursor comprising a support having provided thereon a light-sensitive layer containing fine anatase titanium oxide grains and a complex composed of an organometallic polymer and an organic polymer containing at least one member selected from the group consisting of an amido bond, a urethane bond, a ureido bond and a hydroxy group to an ultraviolet ray to render a surface of the light-sensitive layer hydrophilic in the exposed area.

2. The method for the preparation of a lithographic printing plate as claimed in claim 1, wherein the organometallic polymer is a polymer formed by a hydrolysis polymerization condensation reaction of at least one organometallic compound represented by the following formula (I):

$$(R^0)_n M(Y)_{x-n} \quad (I)$$

wherein $R^0$ represents a hydrogen atoms, a hydrocarbon group or a heterocyclic group; Y represents a reactive group; M represents a metallic atom having from 3 to 6 valences; x represents a valence of the metallic atom M; and n represents 0, 1, 2, 3 or 4, provided that the balance of x–n is not less than 2.

3. The method for the preparation of a lithographic printing plate as claimed in claim 1, wherein a surface of the light-sensitive layer in the area unexposed with the ultraviolet ray has a contact angle with water of 20 degrees or more and the surface of the light-sensitive layer in the area exposed with the ultraviolet ray has a contact angle with water of 10 degrees or less.

4. The method for the preparation of a lithographic printing plate as claimed in claim 1, wherein the imagewise exposure is conducted using an ultraviolet laser beam.

5. The method for the preparation of a lithographic printing plate as claimed in claim 1, wherein an average particle size of the anatase titanium oxide grains is from 5 to 500 nm.

6. The method for the preparation of a lithographic printing plate as claimed in claim 1, wherein the light-sensitive layer contains the anatase titanium oxide grains in a range of from 30 to 95% by weight.

7. The method for the preparation of a lithographic printing plate as claimed in claim 1, wherein the organic polymer is an amide resin having an —N($R^{10}$)CO— or —N($R^{10}$)SO$_2$— bond wherein $R^{10}$ represents a hydrogen atom, a hydrocarbon group or a heterocyclic group, a ureido resin having an —NHCONH— bond or a urethane resin having an —NHCOO— bond.

8. The method for the preparation of a lithographic printing plate as claimed in claim 1, wherein the organic polymer is a polymer containing a repeating unit represented by the following formula (II):

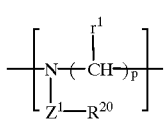

(II)

wherein $Z^1$ represents —CO— or —CS—; $R^{20}$ represents a hydrogen atom, a hydrocarbon group or a heterocyclic group; rrepresents a hydrogen atom or an alkyl group having from 1 to 6 carbon atoms, $r^1$s may be the same or different; and p represents an integer of 2 or 3.

9. The method for the preparation of a lithographic printing plate as claimed in claim 1, wherein a weight ratio of the organo-metallic polymer/organic polymer is from 10/90 to 90/10.

10. A method for the preparation of a lithographic printing plate which comprises after conducting printing using the lithographic printing plate prepared according to the method as claimed in claim 1, removing printing ink from the lithographic printing plate, subjecting the surface of the light-sensitive layer of the lithographic printing plate to heat treatment to turn the hydrophilic property in the exposed area to the inherent hydrophobic property, thereby reproducing the lithographic printing plate precursor, and repeating the method as claimed in claim 1.

11. A lithographic printing plate prepared according to the method as claimed in claim 1.

* * * * *